United States Patent
Jang et al.

(10) Patent No.: US 7,470,461 B2
(45) Date of Patent: Dec. 30, 2008

(54) PRINTED CIRCUIT BOARD AND METHOD OF MANUFACTURING THE SAME

(75) Inventors: Chang-soo Jang, Yongin-si (KR); Dong-kwan Won, Yongin-si (KR); Hyoung-ho Roh, Yongin-si (KR); Jae-chul Ryu, Yongin-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 7 days.

(21) Appl. No.: 11/244,649

(22) Filed: Oct. 5, 2005

(65) Prior Publication Data

US 2006/0105153 A1 May 18, 2006

(30) Foreign Application Priority Data

Nov. 12, 2004 (KR) .................. 10-2004-0092269

(51) Int. Cl.
*B32B 3/00* (2006.01)

(52) U.S. Cl. .................. 428/209; 174/258; 174/73.1; 174/264; 428/901

(58) Field of Classification Search .................. 428/209, 428/901; 174/258, 264, 73.1
See application file for complete search history.

(56) References Cited

U.S. PATENT DOCUMENTS

| | | | | |
|---|---|---|---|---|
| 3,601,523 A * | 8/1971 | Arndt | ........................ | 174/264 |
| 3,610,811 A * | 10/1971 | O'Keefe | ........................ | 174/262 |
| 3,854,973 A * | 12/1974 | Mersereau et al. | ........................ | 428/413 |
| 4,115,185 A * | 9/1978 | Carlson et al. | ........................ | 430/318 |
| 4,751,146 A * | 6/1988 | Maeda et al. | ........................ | 428/475.8 |
| 4,878,152 A * | 10/1989 | Sauzade et al. | ........................ | 361/721 |
| 4,895,752 A * | 1/1990 | McEwen | ........................ | 442/233 |
| 4,981,560 A * | 1/1991 | Kajihara et al. | ........................ | 205/152 |
| 5,126,192 A * | 6/1992 | Chellis et al. | ........................ | 428/323 |
| 5,166,292 A * | 11/1992 | Pottiger et al. | ........................ | 526/59 |
| 5,314,740 A * | 5/1994 | Ishii et al. | ........................ | 428/209 |
| 5,958,562 A * | 9/1999 | Tsuji et al. | ........................ | 428/209 |
| 6,080,684 A | 6/2000 | Appelt et al. | | |
| 6,124,023 A * | 9/2000 | Furuta et al. | ........................ | 428/172 |
| 6,136,733 A | 10/2000 | Blumberg et al. | | |
| 6,174,562 B1 * | 1/2001 | Bergstedt | ........................ | 430/314 |
| 6,201,305 B1 * | 3/2001 | Darveaux et al. | ........................ | 257/779 |
| 6,224,965 B1 * | 5/2001 | Haas et al. | ........................ | 428/209 |
| 6,555,208 B2 * | 4/2003 | Takada et al. | ........................ | 428/209 |
| 6,692,818 B2 * | 2/2004 | Hirano et al. | ........................ | 428/209 |
| 6,713,163 B2 * | 3/2004 | Saito | ........................ | 428/209 |
| 6,740,411 B2 * | 5/2004 | Kojima et al. | ........................ | 428/413 |
| 6,808,798 B2 * | 10/2004 | Tobita | ........................ | 428/298.1 |
| 7,005,750 B2 * | 2/2006 | Liu | ........................ | 257/779 |

* cited by examiner

*Primary Examiner*—Cathy Lam
(74) *Attorney, Agent, or Firm*—Drinker Biddle & Reath LLP (57) ABSTRACT

Provided is a method of manufacturing a printed circuit board. In an embodiment, the method includes forming a prepreg layer via a reel method, forming a conductive film for forming a circuit pattern on at least one surface of the prepreg layer; and forming a predetermined circuit pattern on the conductive film. In an embodiment, the prepreg layer has a thickness of at most about 0.15 mm and contains a fiber material and a resin material. In an embodiment, the content of the resin material in the prepreg layer is about 70% or less by volume. In an embodiment, the prepreg layer is composed of at least one prepreg layer.

13 Claims, 6 Drawing Sheets

PRINTED CIRCUIT BOARD AND METHOD OF MANUFACTURING THE SAME

CROSS-REFERENCE TO RELATED PATENT APPLICATION

This application claims the benefit of Korean Patent Application No. 10-2004-0092269, filed on Nov. 12, 2004, in the Korean Intellectual Property Office, the disclosure of which is incorporated herein in its entirety by reference.

BACKGROUND OF THE INVENTION

1. Field of the Invention

The present invention relates to a printed circuit board and a method of manufacturing the same. More particularly, the present invention relates to a printed circuit board, on which small electronic parts such as chips are mounted, and a method of manufacturing the same.

2. Description of the Related Art

Small electronic parts, such as semiconductor chips, are generally mounted on a printed circuit board. The printed circuit boards can be divided into flexible substrates and rigid substrates.

The rigid substrate typically consists of a raw material layer, an electro deposit copper (Cu) layer, and photo solder resist (PSR) ink. The electrolysis copper foil layer is formed on at least one surface of the raw material layer using a circuit lithography process, and the electrolysis copper foil layer is insulated by the PSR ink. In this case, the raw material layer on which the electrolysis copper foil layer is etched is called a core.

Materials used for forming the core of the rigid substrate, such as bismaleimide triazine (BT) or FR-4, include a prepreg and a resin material disposed around the prepreg. In this case, the prepreg denotes a composite of a glass fiber and a resin.

On the other hand, the flexible substrate is typically formed by a reel-to-reel process. A strip-cutting process for cutting the flexible substrate into strips is performed at the end of all manufacturing processes for forming the flexible substrate.

The rigid substrate is conventionally manufactured in strip units since it is less flexible than the flexible substrate. However, the strip process requires higher manufacturing costs than the reel-to-reel process. Particularly, for mass production, the strip unit process requires a higher cost than the reel-to-reel process by 20-60%.

Recently, as the size of semiconductor packages reduces according to the recent trend in light-weight, slim, short, and small products, the thickness of the substrate has become thinner. Accordingly, as the rigid substrate is thinner, the application of the reel-to-reel process is possible. Therefore, to reduce the manufacturing cost of the rigid substrate, the rigid substrate is manufactured by the reel-to-reel process.

However, when the rigid substrate is manufactured by the reel-to-reel process, bending of the rigid substrate and its core occurs. The main cause of the bending is the difference in the coefficient of thermal expansion between the PSR ink and the core. That is, the coefficient of thermal expansion of the PSR ink is approximately 5 to 6 times greater than that of the core. When a shear force is generated in the PSR ink due to thermal expansion of the PSR ink, bending from the PSR ink toward the core is generated. In this case, the bending of the PSR ink cannot be stopped by the core since the core is thin. The bending of the PSR ink generates cracks between the PSR ink and the core and within the core between the prepreg and the resin material.

Meanwhile, when a chip has to be mounted on the printed circuit board, a device hole can be formed in the printed circuit board using a puncher. Printed circuit boards disclosed in U.S. Pat. Nos. 6,080,684 and 6,136,733 are manufactured by inserting and sintering a glass fiber matrix into a resin material, forming a conductive film on the surface of the hardened resin, forming a circuit pattern by an etching process, and forming device holes by punching the resin material where the chip will be mounted.

When the substrate is a dual-sided substrate in which copper foil layers are formed on both sides of the core, a via hole for connecting the copper foil layers formed on the both sides of the core is formed.

Conventionally, to form the via holes, after sheet shaped cores are stacked in a multiple layer, the holes are mechanically formed using a drill while pressing the sheet shaped cores. In this case, to precisely form the via holes, holes having a certain size are formed in advance using a laser beam in the locations where the via holes are to be formed. Afterward, the via holes or the device holes are formed using a drill. That is, since a laser process and a drilling process must be performed, the manufacturing costs of the printed circuit board increase.

To reduce the manufacturing costs for making the via holes, a punching process can be performed. However, due to the glass fiber included in the printed circuit board, cracks can be generated at punched edges when the printed circuit board is pressed by the punch for punching the device holes or the via holes. The cracks are generated due to the difference in tensile strength between the glass fiber and the resin material. The resin material is readily punched by the pressure of the puncher, but the glass fiber is cut after the glass fiber is bent to some extent. The cracks are generated at boundaries between the conductive film and the resin material, between the glass fiber and the resin material, and between the glass fibers due to the difference in tensile strengths of the materials. The cracks not only degrade the appearance of the products but also adversely affect the fine circuit pattern formed on the conductive film.

Also, when the glass fiber is extended by the puncher while the holes are formed, the extended glass fiber presses the peripheral resin material, thereby deforming the resin material. As a result, white burrs, i.e., tiny cracks generated around the device holes or the via holes, may extend to a surface of the printed circuit board. The fine white burrs of the glass fiber remaining on inner surfaces of the device holes from time to time may cause troubles in a subsequent process.

Also, after the chips are bonded, the bonded portions are molded to protect the bonding portions using an epoxy molding compound (EMC). However, the EMC sometimes may not completely fill the cracks, thereby generating voids and further reducing the reliability of products.

SUMMARY OF THE INVENTION

Various embodiments of the present invention provide a printed circuit board, the printed circuit board having a structure that remains substantially rigid when it is manufactured by a reel-to-reel process. A method of manufacturing the printed circuit board is also provided.

In an embodiment, the printed circuit board is provided to a semiconductor package.

In an embodiment, the present invention provides a printed circuit board that has a structure that does not generate cracks at cutting edges of device holes or via holes when punching the printed circuit board to manufacture the device holes or the via holes.

According to an embodiment of the present invention, there is provided a method of manufacturing a printed circuit board, the method comprising: forming a prepreg layer using a reel method; forming a conductive film; and forming a circuit pattern. More specifically, in an embodiment, the method comprises: forming a prepreg layer which has a thickness of at most about 0.15 mm, and which contains a fiber material and a resin material, the content of the resin material in the prepreg layer is about 70% or less by volume and the prepreg layer is composed of at least one prepreg layer formed via a reel method; forming a conductive film for forming a circuit pattern on at least one surface of the prepreg layer; and forming a predetermined circuit pattern on the conductive film. In the forming of the prepreg layer, the amount of the resin material in the prepreg layer may be at least about 60% by volume.

According to another embodiment of the present invention, there is provided a printed circuit board comprising a prepreg layer; an upper circuit pattern; a lower circuit pattern; and a protection layer, wherein the prepreg layer may have a thickness of about 0.15 mm or less and the amount of the resin material in the prepreg layer may be at least about 60% by volume.

In an embodiment, the prepreg layer may be a stack of at least one layer of unit prepreg that comprises a fiber material and a resin material and may include at least one via hole. In another embodiment, the upper and lower circuit patterns may be electrically connected through the via hole and may be respectively formed on upper and lower surfaces of the prepreg layer. In still another embodiment, the protection layer may cover the circuit pattern.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings in which exemplary embodiments of the invention are shown.

Figure 1:
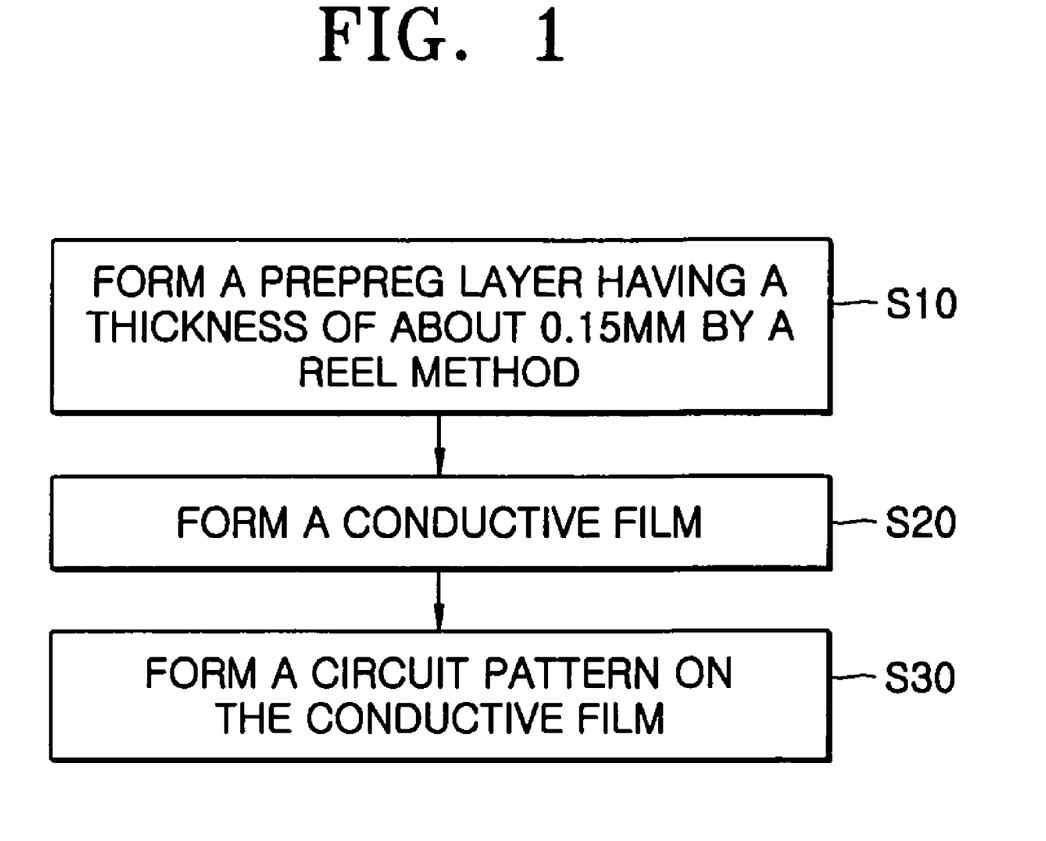
FIG. 1 is a flow chart of a method of manufacturing a printed circuit board according to an embodiment of the present invention.

Referring to FIG. 1, in an embodiment of the present invention, a method of manufacturing a printed circuit board includes: forming a prepreg layer (S10); forming a conductive film on the prepreg layer (S20); and forming a circuit pattern on the conductive film (S30).

The forming of the prepreg layer (S10) is performed by filling a resin material in a fiber material. In an embodiment, the prepreg layer has a thickness of about 0.15 mm or less. Afterward, to form a circuit pattern on at least one surface of the prepreg layer, an operation for forming the conductive film is performed (S20). In an embodiment, the conductive film is comprised of copper. Next, an operation for forming the circuit pattern is performed through etching the conductive film (S30). Afterward, an operation for forming a protection layer, which is typically a solder resist layer, on the circuit pattern can further be performed.

The prepreg layer included in a rigid substrate is formed of a composite of a fiber and a resin. According to an embodiment of the present invention, the printed circuit board for a semiconductor package may be a substantially rigid printed circuit board.

Figure 2:
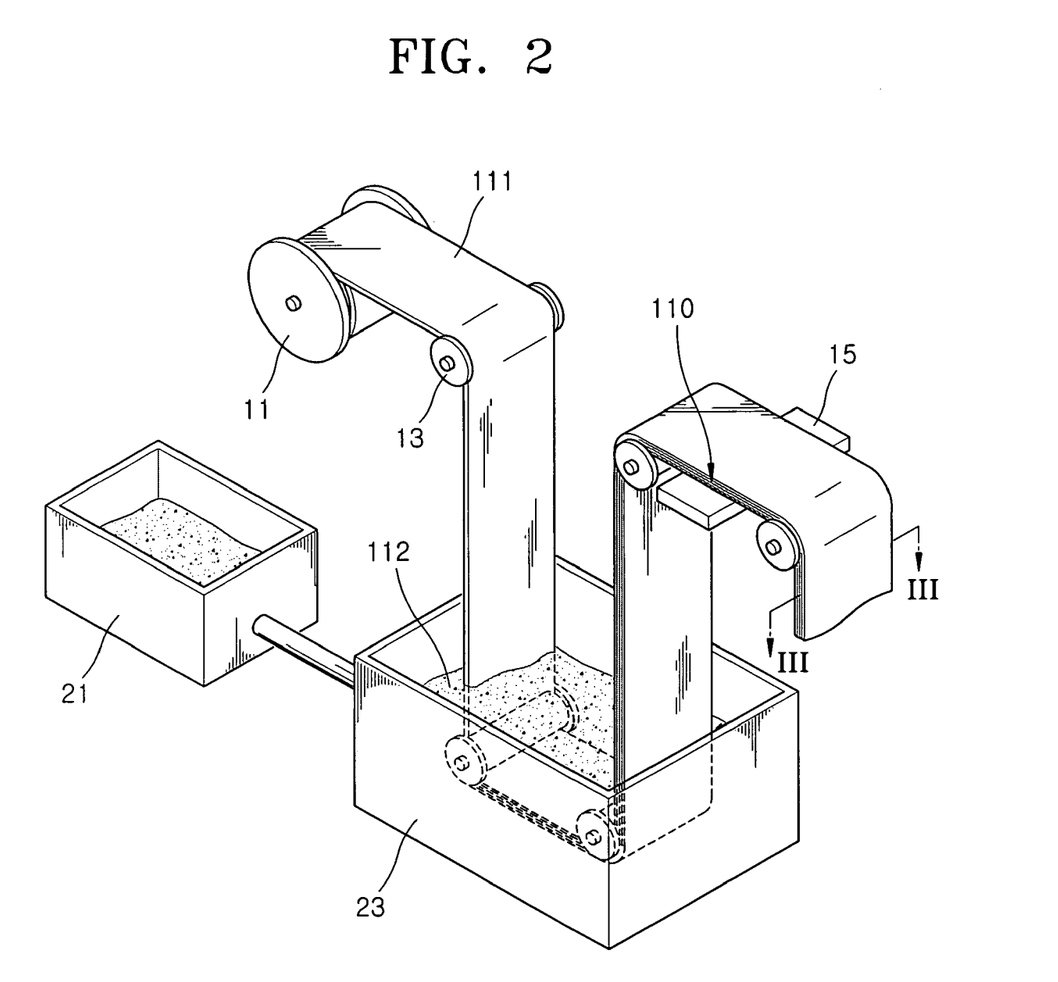
FIG. 2 is a perspective view illustrating a process for forming a prepreg layer according to an embodiment of the present invention.

Referring to FIG. 2, in an embodiment of the present invention, a prepreg layer 110 is supplied by a reel method. That is, a fiber material 111 stacked on a roll supplying equipment 11 in multiple layers is supplied to the filling tank 23 via the reel method. A resin material 112 stored in a resin storage 21 is accommodated in the filling tank 23 in a liquid state. Accordingly, the resin material 112 is infiltrated into the fiber material 111 supplied to the filling tank 23 via the reel method, and the fiber material 111 filled with the resin material 112 is heated in an oven 15 to become one prepreg.

A prepreg layer 110 is formed by one or stacking multiple layers of prepreg. The prepreg layer 110 is a raw material for the printed circuit board. In an embodiment, the printed circuit board is for a semiconductor package.

When the prepreg layer 110 is supplied via the reel method, the prepreg layer 110 must be bent several times by a plurality of rollers 13. Therefore, the typical rigid substrates must be manufactured via a strip method not via a reel method since breakages are generated after a molding process.

The breakages are generated due to not only the thickness and inflexibility of the prepreg layer 110 but also to the difference in the coefficient of thermal expansion (CTE) between the prepreg layer 110 and the protection layer. A solder resist layer, which is a typical protection layer, has a CTE of 60 ppm, whereas that of the prepreg layer is 11 ppm. Therefore, the protection layer formed on at least one surface of the prepreg layer expands more than the prepreg layer. However, if the prepreg layer is thin and flexible, the rigidity of the prepreg layer is also reduced. The prepreg layer accordingly cannot withstand a bending force of the protection layer, thereby causing the dimensional instability of the substrate at a higher temperature and bending of the prepreg layer.

The bending of the prepreg layer can cause fatal defects in the products. For example, the bending may cause a mismatch between a chip die and a semiconductor substrate when the chip die is connected to the semiconductor substrate using a gold wire or a solder ball. Bending also can cause cracks or breakdowns of products by generating a shear force.

Figure 3:
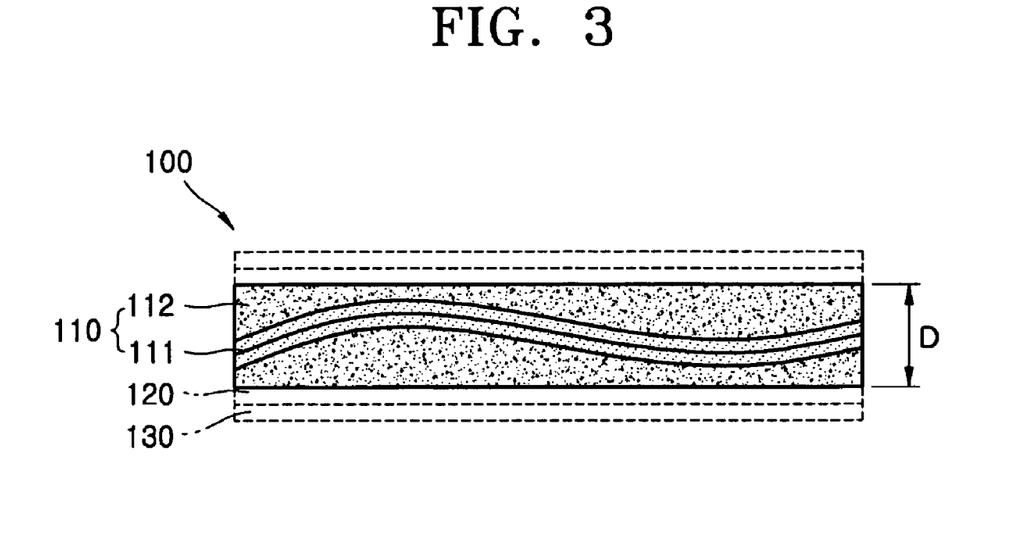
FIG. 3 is a cross-sectional view taken along line III-III of FIG. 2.

Referring to FIG. 3, in an embodiment of the operation for forming the prepreg layer 110 (S10) of the manufacturing process for forming a printed circuit board 100 according to an embodiment of the present invention, the prepreg layer 110 contains less than about 70% of the resin material 112 by volume and is formed to a thickness D of at most about 0.15 mm.

The prepreg layer 110 can be supplied via the reel method by increasing the rigidity of the prepreg layer 110. That is, to prevent the protection layer 130 that covers the circuit pattern 120 from generating a bending force caused by the solder resist layer having the large coefficient of thermal expansion of 60 ppm, the prepreg layer 110 must have increased rigidity. For this purpose, the rigidity of the prepreg layer 110 can be increased by controlling the content of the resin material 112 that constitutes the prepreg layer 110 together with the fiber material 111.

The rigidity of the prepreg layer 110 may be approximately 25 GPa to prevent the prepreg layer 110 from bending by the protection layer 130 having the coefficient of thermal expansion of 60 ppm.

Accordingly, in an embodiment of the present invention, to form the prepreg layer 110 having a rigidity greater than about 25 GPa, the preprag layer 110 is controlled to contain at most about 70% of the resin material 112 by volume. According to a measurement result of a board-on-chip package having the prepreg layer 110 with a thickness of about 0.15 mm, cracks were generated after the prepreg layer 110 was molded when the content of the resin material 112 in the prepreg layer 110 was 72% or more by volume.

In an embodiment, the fiber material 111 can be a glass fiber.

When the content of the resin material 112 in the prepreg layer 110 decreases, the relative amount of the fiber material 111 having low CTE relatively increases, and accordingly, the overall coefficient of thermal expansion decreases. The over-reduction of the CTE of the prepreg layer 110 may reduce the flexibility of the prepreg layer 110 and make it difficult to apply the reel method. Accordingly, in the operation of forming of the prepreg layer 110, it is desirable that the prepreg layer 110 is formed to have a coefficient of thermal expansion of about 10 ppm to about 14 ppm.

In an embodiment, the prepreg layer 110 may be formed of FR-4 or BT. The FR-4 in particular has high hygroscopic property, high burning resistance, high adhesiveness, and superior electrical characteristics. In this case, the coefficient of thermal expansion of the prepreg layer 110 can be controlled by the amount of filler added to the resin material 112.

In the operation of forming of the prepreg layer 110, the prepreg layer 110 may be formed to contain at least about 60% of the resin material 112 by volume to prevent the resin material 112 and the fiber material 111 from partly separating from each other due to a reduced adhesiveness during a punching process.

Figure 4:
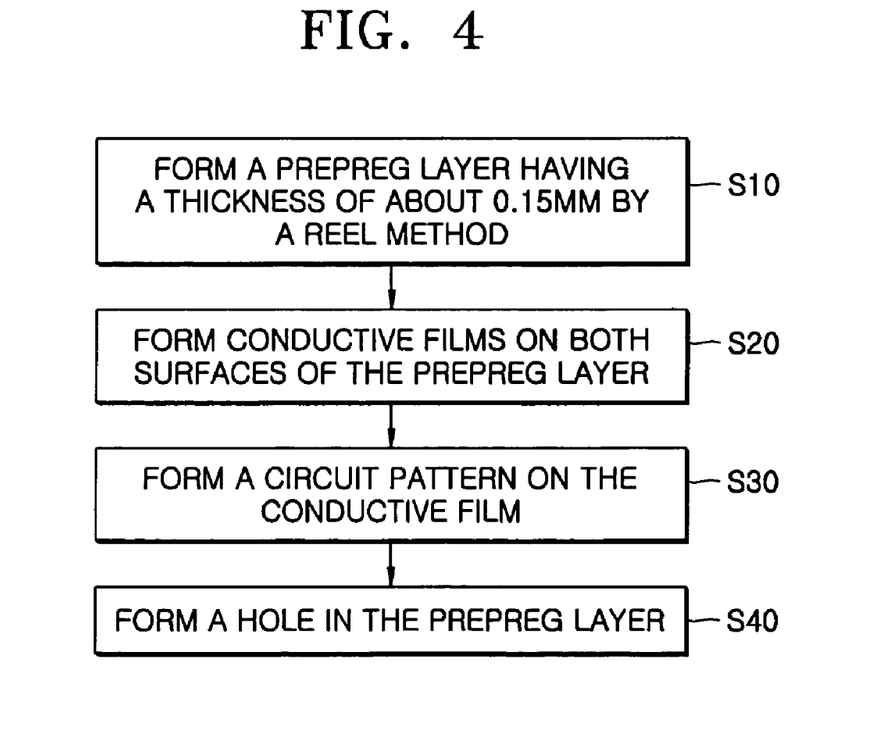
FIG. 4 is a flow chart of a method of manufacturing a printed circuit board according to another embodiment of the present invention.
Figure 5:
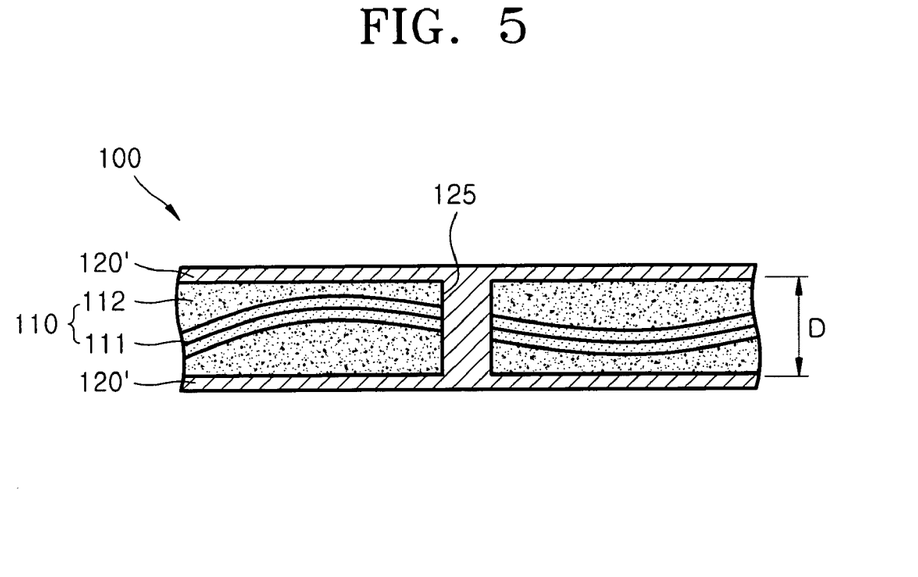
FIG. 5 is a cross-sectional view of the prepreg layer of FIG. 4 taken along line III-III of FIG. 2.

As depicted in FIGS. 4 and 5, as an example of the punching process, in the operation for forming conductive films 120', the conductive films 120' are formed on both surfaces of the prepreg layer 110. Also, in the method of making a printed circuit board 100, an operation for forming a hole 125 in the prepreg layer 110 can further be included (S40). In this case, the hole 125 can be a via hole that connects the circuit patterns 120 formed on both surfaces of the prepreg layer 110 when a dual sided substrate is manufactured.

In this case, the printed circuit board 100 can be a multiple layer substrate in which the conductive film 120', the resin material 112, and the fiber material 111 are stacked as multi-layers.

An example of a method of forming the hole 125 in the printed circuit board 100 will now be described. First, the surface of the conductive film 120' is pretreated. The pretreating process can be a washing process. Next, a poly resist film, which is a photosensitive film, is coated on the conductive film 120', and a portion of the conductive film 120' where the hole 125 will be formed is exposed by etching and developing the poly resist film. Then, after the portion of the conductive film 120' exposed is removed, the photosensitive film is exfoliated. At this time, patterning of other circuits can be performed at the same time as the removal of the portion of the conductive film 120' in which the hole 125 will be formed.

Afterward, an operation for forming the hole 125 on a surface-treated layer is performed by perforating the portion of the surface-treated layer from which the conductive film 120' is removed (S40). In an embodiment of the present invention, the forming of the hole 125 (S40) can be performed after the forming of the circuit pattern (S30) as depicted in FIG. 4. In another embodiment, the forming of the hole 125 (S40) can be performed before the forming of the circuit pattern (S30).

Figure 6:
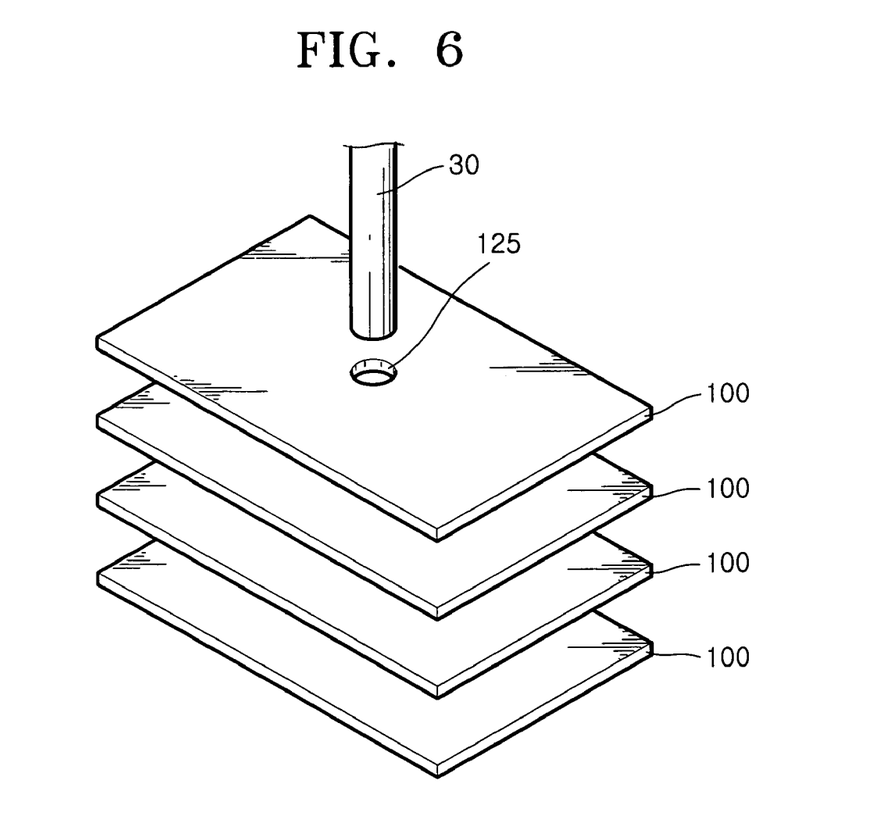
FIG. 6 is a perspective view illustrating a process for forming holes of FIG. 5.

The forming of the hole 125 in the surface-treated layer (S40), as depicted in FIG. 6, may be performed by a puncher after the stacked printed circuit boards 100 are fixed using a jig.

That is, in an embodiment of the present invention, a punching process is possible since the prepreg layer 110 is formed via the reel method. Accordingly, the prepreg layer 110 can be manufactured at lower costs than when using drill processing.

In an embodiment of the present invention, to prevent the resin material 112 and the fiber material 111 from separating from each other during the punching process due to a difference in tensile strength therebetween, the prepreg layer 110 is formed to have a content of the resin material 112 greater than about 60% by volume.

Figure 7A:
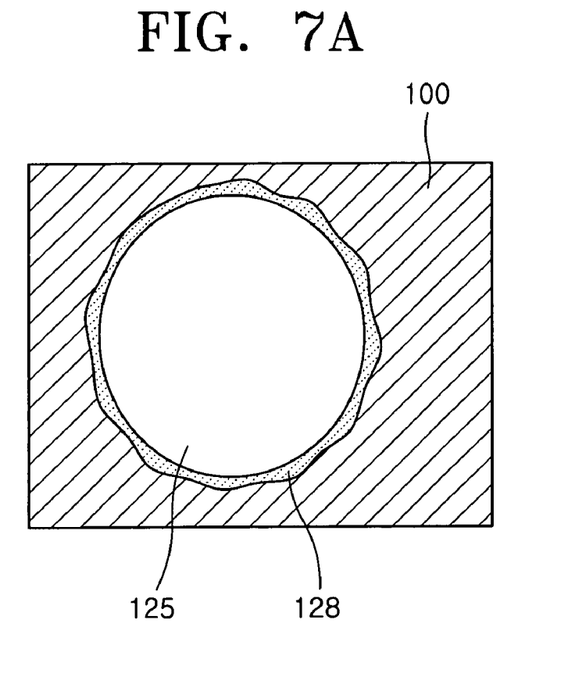
FIG. 7A is a cross-sectional view of a hole of a prepreg layer manufactured by a method of manufacturing a conventional printed circuit board for semiconductor packages.

As depicted in FIG. 7A, in a conventional prepreg layer, a white burr 128 is generated around the hole 125, and delamination is generated at an interface between the resin material 112 and the fiber material 111.

Figure 7B:
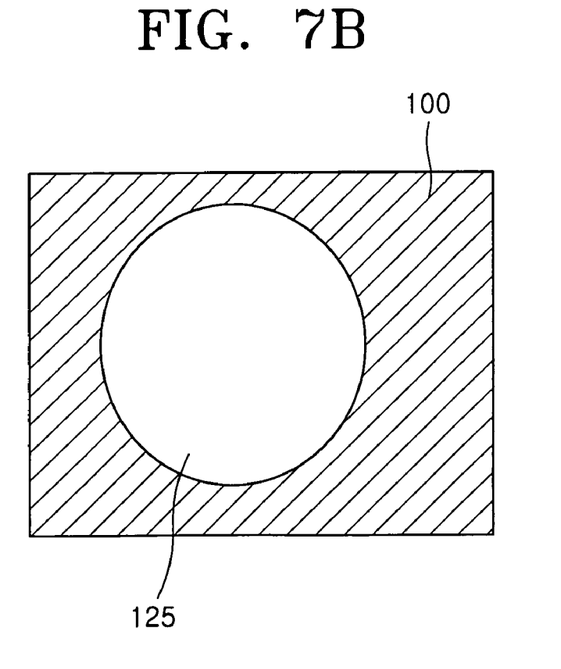
FIG. 7B is a cross-sectional view illustrating a hole of a prepreg layer manufactured by a method of manufacturing a printed circuit board according to an embodiment of the present invention.

However, in the present invention, the adhesiveness between the resin material 112 and the fiber material 111 is increased by maintaining the content of the resin material 112 in the prepreg layer 110 greater than about 60% by volume and, at the same time, by concentrating stresses generated during a punching process on the fiber material 111 instead of the resin material 112. Therefore, as depicted in FIG. 7B, the generation of the delamination at the interface between the resin material 112 and the fiber material 111 can be prevented and the generation of the white burr 128 around the hole 125 can also be prevented or at least reduced.

Figure 8:
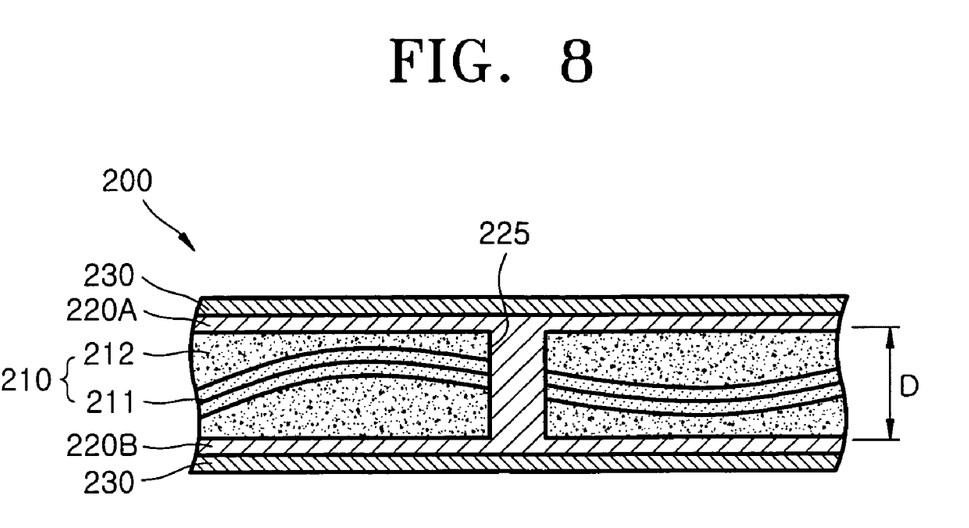
FIG. 8 is a cross-sectional view illustrating a printed circuit board according to another embodiment of the present invention.

Referring to FIG. 8, a printed circuit board 200 according to another embodiment of the present invention includes a prepreg layer 210 in which at least one via hole 225 is formed and upper and lower circuit patterns 220A and 220B formed on upper and lower surfaces, respectively, of the prepreg layer 210, wherein the prepreg layer 210 is formed by stacking at least one unit prepreg which includes a resin material 212 and a fiber material 211'. In an embodiment, the fiber material 211 may be a glass fiber.

The upper and lower circuit patterns 220A and 220B are electrically connected to each other through the via hole 225. That is, the printed circuit board 200 is a dual sided substrate, and the via hole 225 is formed between the upper and lower circuit patterns 220A and 220B. Accordingly, a punching process is required to form the via hole 225.

The Orepreg layer 210 may be formed to a thickness D of about 0.15 mm or less and may contain at least about 60% of the resin material 212 by volume so that the prepreg layer 210 can be formed via the reel method. As described above, this is because the adhesiveness between the resin material 212 and the fiber material 211 can be increased by maintaining the amount of the resin material 212 in the prepreg layer 210 at a level greater than a certain level. Also, this is because the delamination generated at an interface between the resin material 212 and the fiber material 211 and the white burr 128 (see FIG. 7A) generated around the punching hole can be prevented or at least minimized by concentrating stresses generated during punching on the fiber material 211 instead of the resin material 212.

In an embodiment, protection layers 230, such as solder (photo) resist layers, are formed on upper and lower circuit patterns 220A and 220B. In this case, a prepreg layer 210 is manufactured via the reel method, and the content of the resin material 212 in the prepreg layer 230 may be about 70% or less by volume. That is, the prepreg layer 210 can be supplied via the reel method by increasing the rigidity of the prepreg layer 210 to a certain level. That is, to prevent the printed circuit board 200 from bending due to the high coefficient of thermal expansion (approximately 60 ppm) of the protection layer 230, the rigidity of the prepreg layer 210 can be increased by controlling the amount of the resin material 212 in the prepreg layer 210 to be about 70% or less by volume together with the fiber material 211.

When the amount of the resin material 112 in the prepreg layer 110 decreases, the relative amount of the fiber material 211 having a low coefficient of thermal expansion increases, and accordingly, the overall coefficient of thermal expansion of the prepreg layer 110 decreases. However, the over-reduction of the CTE of the prepreg layer 110 may result in reducing the flexibility of the prepreg layer 110 and make it difficult to apply the reel-to-reel method. Accordingly, it is desirable that the prepreg layer 210 is formed to have the coefficient of thermal expansion of about 10 ppm to about 14 ppm.

In this case, the coefficient of thermal expansion of the prepreg layer 210 can be controlled by a filler added to the resin material 212.

In various embodiments of the present invention, the manufacturing cost of the printed circuit board can be significantly reduced since the printed circuit board can be manufactured via the reel method.

Also, in an embodiment of a printed circuit board manufactured via the reel method, the printed circuit board remains substantially rigid due to the increased rigidity of the fiber material.

Also, in an embodiment of the present invention, the amount of the resin material in the prepreg layer is maintained at about 60% or more by volume. Therefore, the adhesiveness between the fiber material and the resin material is increased, thereby preventing the generation of delamination at an interface between the resin material and the fiber material during a punching process.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A printed circuit board comprising:
   a generally parallelepiped-shaped prepreg having a volume, a first CTE, a rigidity of about 25 GPa and a thickness of about 0.15 mm, the prepreg consisting of a fiber material and a resin material that, when cured, encapsulates the fiber material and the resin material occupies about 60% to about 70% of the volume;
   a circuit pattern on at least one surface of the generally parallelepiped-shaped prepreg; and
   a protection layer only on the circuit pattern, the protection layer having a second CTE,
   a difference of about 50 ppm is between the first CTE and the second CTE concentrating on the fiber layer bending stresses due to thermal expansion or via hole punching.

2. The printed circuit board of claim 1 wherein the protection layer is a solder resist and the second CTE is about 60 ppm.

3. The printed circuit board of claim 2 wherein the first CTE is in a range of about 10 ppm to about 14 ppm.

4. The printed circuit board of claim 3 further comprising a filler mixed with the resin material for adjusting the first CTE within the range of about 10 ppm to about 14 ppm.

5. The printed circuit board of claim 1 further comprising a hole punched in the prepreg after curing of the resin material, the fiber material and the resin material being formulated to resist delamination of an interface between the fiber material and the resin material during punching of the hole.

6. The printed circuit board of claim 5 farther comprising an electrical connection through the hole that links a first circuit pattern on a first surface of the prepreg with a second circuit pattern on a second surface of the prepreg.

7. A printed circuit board comprising:
   a prepreg including a fiber layer and a resin that infiltrates and, when cured, encapsulates the fiber layer, the prepreg having a resin content between 60% and 70% by volume, a rigidity of about 25 GPa, a CTE of about 10 ppm and a thickness of about 0.15 mm or less;
   a circuit pattern on at least one surface of the prepreg; and
   a protection layer only on the circuit pattern, the protection layer having a CTE of about 60 ppm, the protection layer cooperating with the resin content to concentrate bending forces due to thermal expansion on the fiber layer.

8. The printed circuit board of claim 7 further comprising:
   a hole formed in the prepreg by punching, wherein the fiber layer and the resin are formulated to prevent delamination of an interface between the fiber layer and the resin during punching.

9. The printed circuit board of claim 8 further comprising:
a first circuit on a first surface of the prepreg;
a second circuit on a second surface of the prepreg; and
a third circuit extending through the hole that electrically connects the first and second circuits.

10. The printed circuit board of claim 8 wherein the fiber layer is glass fiber.

11. The printed circuit board of claim 10 wherein the protection layer consists of solder resist.

12. The printed circuit board of claim 7 farther comprising a filler mixed with the resin, the filler controlling the CTE of the prepreg.

13. The printed circuit board of claim 12 wherein an amount of the filler adjusts the CTE of the prepreg within a range of about 10 ppm to about 14 ppm.

* * * * *